US 6,441,492 B1

(12) United States Patent
Cunningham (10) Patent No.: US 6,441,492 B1
(45) Date of Patent: Aug. 27, 2002

(54) DIFFUSION BARRIERS FOR COPPER INTERCONNECT SYSTEMS

(76) Inventor: James A. Cunningham, 19771 Junipero Way, Saratoga, CA (US) 95070

( * ) Notice: Subject to any disclaimer, the term of this patent is extended or adjusted under 35 U.S.C. 154(b) by 0 days.

(21) Appl. No.: 09/672,473

(22) Filed: Sep. 28, 2000

Related U.S. Application Data

(63) Continuation-in-part of application No. 09/657,740, filed on Sep. 8, 2000, which is a continuation-in-part of application No. 09/642,140, filed on Aug. 18, 2000, which is a continuation-in-part of application No. 09/619,587, filed on Jul. 19, 2000.
(60) Provisional application No. 60/159,068, filed on Oct. 12, 1999, and provisional application No. 60/153,400, filed on Sep. 10, 1999.

(51) Int. Cl.$^7$ ............................................. H01L 23/48
(52) U.S. Cl. ........................ 257/762; 257/763; 257/764
(58) Field of Search ........................ 257/748, 750–754, 257/762–764

(56) References Cited

U.S. PATENT DOCUMENTS

| | | | |
|---|---|---|---|
| 4,233,067 A | 11/1980 | Sawada | 75/153 |
| 4,592,891 A | 6/1986 | Nishikawa et al. | 420/491 |
| 4,732,731 A | 3/1988 | Asai et al. | 420/473 |
| 4,750,029 A | 6/1988 | Futatsuka et al. | 357/67 |
| 4,908,275 A | 3/1990 | Tsuji et al. | 428/458 |
| 4,986,856 A | 1/1991 | Tanigawa et al. | 148/11.5 C |
| 5,130,274 A | 7/1992 | Harper et al. | 437/195 |
| 5,143,867 A | 9/1992 | d'Heurle et al. | 437/188 |
| 5,592,024 A | 1/1997 | Aoyama et al. | 257/751 |
| 5,624,506 A | 4/1997 | Tsuzaki et al. | 148/433 |
| 5,674,787 A | 10/1997 | Zhao et al. | 437/230 |
| 5,694,184 A | 12/1997 | Yamada et al. | 349/43 |
| 5,719,447 A | 2/1998 | Gardner | 257/762 |
| 5,789,320 A | 8/1998 | Andricacos et al. | 438/678 |
| 6,037,257 A | 3/2000 | Chiang et al. | 438/687 |
| 6,037,664 A | 3/2000 | Zhao et al. | 257/758 |
| 6,060,892 A | 5/2000 | Yamagata | 324/754 |
| 6,066,892 A | 5/2000 | Ding et al. | 257/751 |
| 6,077,780 A | 6/2000 | Dubin | 438/687 |
| 6,147,402 A | 11/2000 | Joshi et al. | 257/751 |
| 6,157,081 A | 12/2000 | Nariman et al. | 257/752 |
| 6,174,799 B1 | 1/2001 | Lopatin et al. | 438/627 |
| 6,181,012 B1 | 1/2001 | Edelstein et al. | 257/762 |
| 6,188,120 B1 * | 2/2001 | Andricacos et al. | 257/532 |
| 6,201,271 B1 * | 3/2001 | Okutoh et al. | 257/295 |

FOREIGN PATENT DOCUMENTS

| | | | |
|---|---|---|---|
| JP | 60110868 | 6/1985 | C23C/8/42 |
| JP | 62127438 | 6/1987 | C22C/9/00 |
| JP | 62133050 | 6/1987 | C22F/1/08 |
| JP | 1028337 | 1/1989 | C22C/9/06 |
| JP | 1056842 | 3/1989 | C22C/9/00 |
| JP | 2230756 | 9/1990 | H01L/21/80 |
| JP | 9157775 | 6/1997 | C22C/9/00 |
| JP | 10008167 | 1/1998 | C22C/9/04 |
| JP | 11054713 A * | 2/1999 | |

* cited by examiner

Primary Examiner—Minh Loan Tran
Assistant Examiner—Thomas L. Dickey
(74) Attorney, Agent, or Firm—Allen, Dyer, Doppelt, Milbrath & Gilchrist, P.A.

(57) ABSTRACT

An integrated circuit includes a substrate, at least one dielectric layer adjacent the substrate, and an interconnect structure in the at least one dielectric layer and comprising a copper portion and a barrier layer between the copper portion and adjacent portions of the at least one dielectric layer. Moreover, the barrier layer preferably comprises at least one of rhodium, ruthenium and rhenium. These materials are virtually insoluble and immiscible in copper, and can be readily deposited by electroless deposition, for example. The barrier layer may be in contact with the adjacent portions of the at least one dielectric layer. In addition, at least one other barrier layer can be provided between the barrier layer and the copper portion. The interconnect structure in some embodiments may extend both laterally and vertically within the at least one dielectric layer.

34 Claims, 2 Drawing Sheets

DIFFUSION BARRIERS FOR COPPER INTERCONNECT SYSTEMS

RELATED APPLICATION

This application is based upon provisional application Ser. No. 60/159,068, filed Oct. 12, 1999, now Ser. No. 60/153,400, filed Sep. 10, 1999, and is a continuation-in-part of U.S. patent application Ser. No. 09/657,740 filed Sep. 8, 2000, which, in turn, is a continuation-in-part of U.S. patent application Ser. No. 09/642,140 filed on Aug. 18, 2000, which, in turn, is a continuation-in-part application of U.S. patent application Ser. No. 09/619,587 filed on Jul. 19, 2000, the entire disclosures of all of which are incorporated herein by reference.

FIELD OF THE INVENTION

The invention relates to the field of integrated circuits, and more particularly, to the field of fabrication of current carrying interconnects, contacts, and vias.

BACKGROUND OF THE INVENTION

By the mid-1999 time frame, the integrated circuit industry was on its way to an apparent conversion of aluminum alloy based interconnects to a copper-based technology. Motivations for this change included the lower resistivity of copper, its higher electromigration resistance, and possible cost reductions from the damascene process which typically used lower cost electro-chemically deposited copper. The lower resistivity of copper held the promise of reduced RC delays in the interconnects, thus enabling higher performance circuits. This was particularly important for high performance logic applications, such as microprocessor chips where clock rates escalated with each new generation.

The status of this effort and some of the technical problems being faced may be found, for example, in two articles which appeared in the August 1999, Semiconductor International: (1) "Aluminum Persists as Copper Age Dawns" by Alexander E. Braun, pg 58, and (2) "Dual Damascene Challenges Dielectric Etch" by Peter Singer, pg. 68.

As explained in the second article and in other contemporaneous technical literature, the dual damascene process requires two etch-stop layers. They are generally composed of CVD silicon nitride. One nitride layer is at the bottom over the substrate, and the other lies at an intermediate position defining the bottom of the trench. In dual damascene, the interconnect metal is deposited or let into both the trench and into the underlying via. The metal is formed within both simultaneously.

The high selectively possible between silicon oxide dielectrics and a nitride dielectric, employing known plasma etch chemistries, allows the via opening to the underlying conductor to be held to a controlled diameter and also allows some misalignment to the underlying metal target. The via diameter may be almost as small as the minimum feature size of the particular technology, that is, on the order of a 0.25 micron by the late 1990's.

Accepted industry jargon refers to a via as an electrical connection from one level of interconnect to another. A contact is generally considered a metal electrical connection to doped silicon, and as such, refers to structures which normally are found under the interconnects. (An rare exception to this positional relationship may be a "contact" to a doped polysilicon interconnect.)

Vias and contacts may be self-aligned to the underlying target conductor. This means that some degree of mis-registration is allowed, in other words, the cylindrically shaped dielectric opening or aperture may be somewhat outside the metal target area. The bottom metal may not have to be larger than the contact or via aperture. In some cases, such a structure has been referred to as a borderless contact or via. The patent literature contains many varied schemes for achieving such structures. Most of the approaches employ etch stops, an idea that is quite old going back at least as early as Haskell's U.S. Pat. No. 5,057,902 filed in 1989. Other schemes, mainly for self-aligned contacts to MOS transistors, use edge spacers, or spacers and etch stops. Various etch stop materials have been proposed, but silicon nitride dominates actual use in the industry. A self-aligned structure allows tighter design rules, and, thus, improves the packing density—a major driving force in the industry.

If the nitride etch stop layers are not present in the dual damascene scheme, the system may not be used for self-aligned vias. This is because when the trench is etched with the via aperture already formed, which is the usual practice, the insulator adjacent to the metal conductor can be severely over etched, possibly all the way down to underlying conductive structures. This could create a short. And, in some cases, the opening next to the bottom conductor could assume a very narrow slit geometry which could be difficult to cover with a barrier layer by conventional techniques. The upper or intermediate nitride layer forms an etch stop for accurately locating the bottom of the trench.

The lower level nitride layer in dual damascene may also serve as a diffusion barrier over an underlying copper interconnect.

With good oxide/nitride etch selectively and proper sequencing of the dielectric film removal process, a self-aligned via may be provided in the dual damascene process to an underlying tungsten plug or copper conductor. But the nitride layers, with their high dielectric constant relative to $SiO_2$ (about 7.5 vs. 3.9) increases the capacitive coupling between interconnects, thereby increasing RC delays. This is a strongly negative factor in the development of interconnects for modern high performance logic applications.

Indeed, a great deal of work was under way in the late 1990's to develop a lower dielectric constant interconnect dielectric, that is, a replacement for more or less pure $SiO_2$. But no clear winner had emerged by mid-1999. Candidates for low k materials included: fluorine containing silicon oxides; porous spin-on-glasses; spin-on glasses containing only hydrogen, oxygen and silicon; and various polymers such as polyimide.

In a related area, the electromigration resistance of copper vias may be degraded by flux divergence at the copper barrier metal or tungsten interface.

Another concern in copper-based metal systems is that the diffusion barrier within very narrow high-aspect ratio vias may be such that the barrier thickness is not uniform or continuous and copper may migrate into the inter-metal dielectric and degrade the interconnect leakage characteristics or diffuse downward into the active area causing shifts in transistor characteristics.

SUMMARY OF THE INVENTION

In view of the foregoing background, an object of this invention is to provide a copper-based interconnect system with relative freedom from the problems mentioned above. For example, the copper-based interconnect system in accordance with the invention may not have: increased capacitive coupling from the presence of nitride etch stop layers; excessive degradation of the electromigration resistance of the interconnects as a result of void formation at the vias; excessive copper diffusion through a nonuniform barrier layer on the side walls of vias; and an inability of the system to provide self-aligned vias.

These and other objects, features and advantages in accordance with the present invention are provided by an integrated circuit comprising a substrate, at least one dielectric layer adjacent the substrate, and an interconnect structure in the at least one dielectric layer and comprising a copper portion and a barrier layer between the copper portion and adjacent portions of the at least one dielectric layer. Moreover, the barrier layer preferably comprises at least one of rhodium, ruthenium and rhenium. These materials are virtually insoluble and immiscible in copper, and can be readily deposited by electroless deposition, for example.

The barrier layer may be in contact with the adjacent portions of the at least one dielectric layer. In addition, at least one other barrier layer can be provided between the barrier layer and the copper portion.

The interconnect structure in some embodiments may extend both laterally and vertically within the at least one dielectric layer. In other words, the interconnect structure may include a laterally extending interconnect line and one or more vias.

The barrier layer may also comprise at least one of chromium, tungsten, tantalum, and molybdenum. The barrier layer may also comprise silicon. These materials may also be deposited using sputter deposition, for example.

In some embodiments, an adhesion layer may be provided between the barrier layer and adjacent portions of the at least one dielectric layer. For example, the adhesion layer may comprise titanium.

The copper portion may comprise a copper alloy. In addition, the copper portion may include at least one of calcium, cadmium, zinc, neodymium, tellurium, and ytterbium as a dopant to further enhance electromigration properties.

DETAILED DESCRIPTION OF THE PREFERRED EMBODIMENTS

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout.

Figure 1:
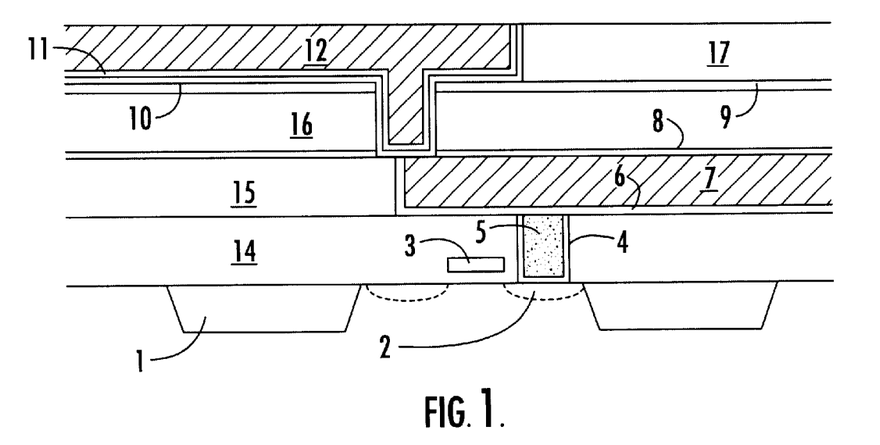
FIG. 1 is a cross-sectional view of a portion of an integrated circuit device illustrating a prior art dual-damascene copper-based interconnect with a tungsten plug contact showing a self-aligned copper via to an underlying copper metal one interconnect.

Referring initially to FIG. 1, an integrated circuit portion 10 including a prior art copper-based dual damascene system is first described. The integrated circuit 10 includes a substrate 11 with has shallow trench isolation (STI) areas 12, and source/drain doped silicon regions 13. A gate electrode 14 is formed above the substrate surface between the source/drain regions 13. A tungsten plug 15 extends downwardly to contact a source/drain region 13. The opening for the tungsten plug 15 is lined with contacting barrier and adhesion films 16.

The flat upper surface over the tungsten plug 15 represents CMP processing. Contacting the tungsten plug 15 is a single-damascene metal-one copper interconnect level 17 with an associated barrier metal layer 18 typically Ta, TaN or other refractory metal or compound. After CMP, the copper metal-one interconnect level 17 is coated with nitride film 24. Stacked layers 20, 21, 22 and 23 are $SiO_2$ dielectric layers typically deposited using high density plasma CVD methods (HDPCVD) as will be appreciated by those skilled in the art. Nitride layers 24 and 25 are used as etch stop layers. The integrated circuit 10 also illustratively includes a barrier layer 26 and a seed layer 27 lining the opening for the second interconnect 12. The second or upper copper interconnect level 28 is typically plated copper and is shown after CMP planarization as will be appreciated by those skilled in the art.

The upper copper interconnect level 28 is shown misaligned to the edge of the copper one interconnect level 17. This represents a self-aligned structure. This is accomplished by first etching the via aperture through the upper nitride film 25, but stopping at the lower nitride layer 24. The resist is stripped and the trench mask is applied. The intermediate dielectric layer 22 is then etched to the lower nitride 24 using oxide-only etching chemistry. Finally, changing chemistries again, the exposed nitride film 24 is etched with nitride etching chemistry exposing the copper surface, but not appreciably etching the $SiO_2$ next to the edge of the copper one interconnect level 17.

Figure 2:
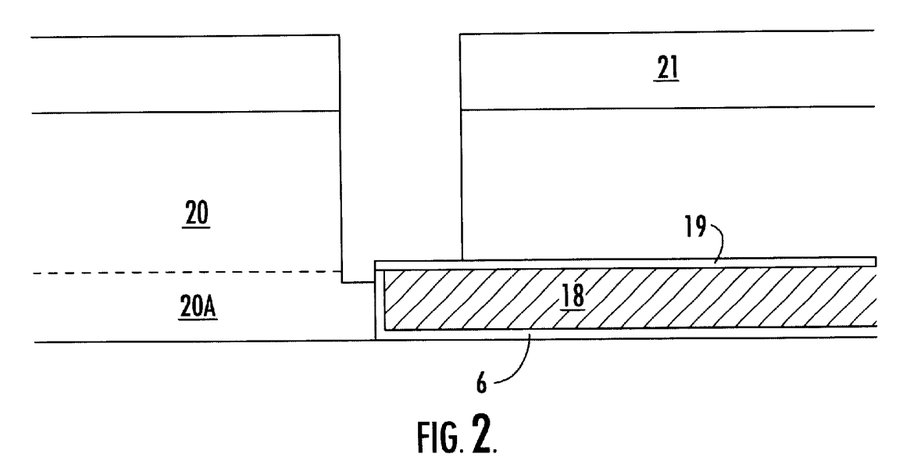
FIG. 2 is a cross-sectional view of a portion of an integrated circuit device illustrating forming of an aperture through the dielectric for a self-aligned contact according to the invention.

Referring now to FIG. 2 an early stage in preparation of an embodiment of the invention is now described. A single damascene copper interconnect line 57 is illustrated adjacent a substrate 51. For clarity of illustration other structures and layers beneath the copper interconnect line 57 are not shown. The copper interconnect line 57 with its associated barrier metal layer 58 are CMP planarized to the dashed line 61. A dielectric layer 62 is the dielectric layer into which the interconnect line 57 is let or formed as will be appreciated by those skilled in the art. Dielectric layer 63 is formed over the lower dielectric layer 61. The dielectric layers 61, 63 may be any suitable dielectric material, such as $SiO_2$, for example, which may be deposited by HDPCVD. In addition, the dielectric layers 61, 63 may have a substantially uniform etch rate from top to bottom.

The exposed copper surface is then activated with $PdCl_2$, for example, and then electrolessly plated with Co+P, Co+P+W or Co, forming an upper layer 65 as shown in the illustrated embodiment. Lopatin, et. al, showed that an alloy of Co(87%)W(2%)P(11%) may be selectively applied to copper by first activation with a $PdCl_2$+dilute HF. Lopatin used 150–200 ml/l of HF with 1% $PdCl_2$ solution for 2–3 seconds. This paper is entitled "Electroless Cu and barrier layers for sub-micron multilevel multilevel interconnects" is found in SPIE Vol. 3214 (1997), pg. 21, and is incorporated hereby by reference in its entirety.

Workers at IBM selectively deposited Co+P alloy on copper in the presence of polyimide by activating the surface with a Pd containing solution. U.S. Pat. No. 5,380,560, for example, lists details on Pd ion concentration and immersion times for this type of work. This patent is also incorporated in its entirety by reference. The IBM researchers suggest that in order to assure selectively, the device may be rinsed in citrate solution to remove extraneous metal deposition between copper lines. The IBM papers discussing this work may be found in E. J. O'Sullivan, et al, "Electrolessly deposited diffusion barriers for microelectronics," IBM J. Res. Dev., Vol.42, No.5, September, 1998, pg. 607; and Milan Paunovic, et al, "Electrochemically Deposited Diffusion Barriers," J. Electrochem. Soc., 141, No. 7, July 1994, pg. 1843. These paper are also incorporated herein by reference in their entirety. The Co-based barrier may be deposited to a thickness of about 100 to 500 A.

Following the barrier layer 65 deposition, an anneal at around 400° C. for several hours would diffuse in the Co a few monolayers deep such that a hardened, more electromigration resistant skin of Cu+Co alloy would exist in the copper interconnect surface.

Figure 3:
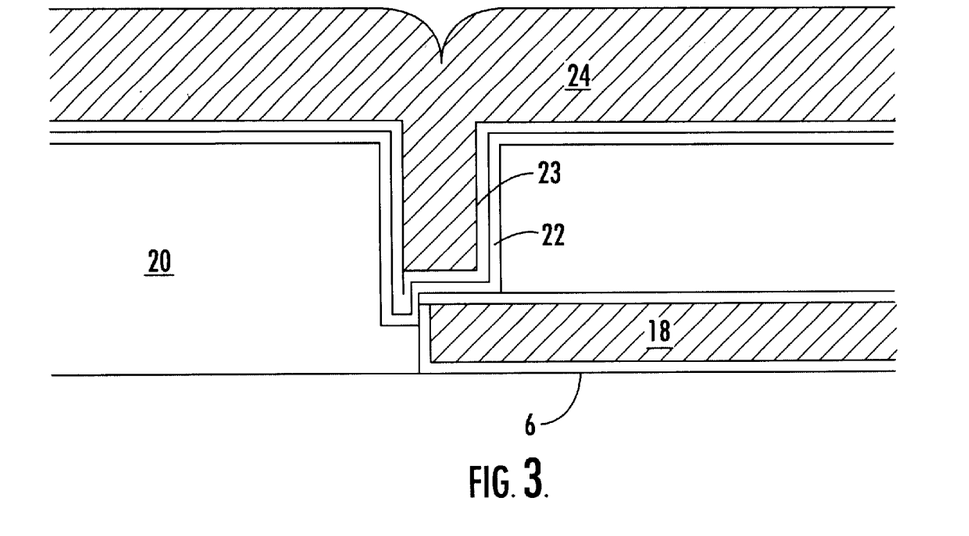
FIG. 3 is a cross-sectional view of the integrated circuit device of FIG. 2 after forming the barrier and seed layers and plating the copper.

Electrolessly plated metal films tend to be more conformal and uniform in thickness than films deposited by sputtering, for example. FIG. 3 shows the integrated circuit device 50 after formation of an electrolessly deposited barrier layer 66, a Cu or an alloy seed layer 67, and the thick electroplated copper or copper alloy layer 68. The barrier layer 66 may also be a Co+P or Co+W+P or Co layer as described above, but in this case, the plating is onto an insulator.

This may be accomplished, as is known in the art, by first immersion of the wafers into stannous chloride solution followed by immersion into $PdCl_2$ solution. This and other activation processors for dielectrics, and metals which do not normally receive plated deposits such chromium, is given in U.S. Pat. No. 4,181,760 to Feldstein which is incorporated herein by reference in its entirety. This activation film may be only a monolayer in thickness.

The activation is followed by deposition of the alloy seed layer 67, such as Cu+about 1 to 5% Cd or Zn. Other dopants may be used also, as described in the listed applications by Cunningham at the end of this detailed description. This layer 67 may be electroplated or deposited by electroless methods. Prior to its application, the surface of the barrier layer 66 may be activated using $PdCl_2$. The seed layer 67 would be about 100 to 400 Å thick. The alloy is more electromigration resistant than undoped Cu and protects the via from unwanted void formation when current flows at high current density upward into the via. The barrier layer 65 and its associated thin Cu alloy protects the via from downward current flow.

The seed layer 67 may be also deposited by sputtering. The dopants in the seed layer may be driven into the overlying copper layer 68 by a heat treatment, as described in greater detail in U.S. patent application Ser. No. 09/045,610, for example.

The thick copper film 68 may be electroplated Cu or a Cu alloy which includes a dopant, such as described in U.S. patent applications, Ser. No. 09/045,610 filed on March 20, Ser. No. 09/148,096 filed on Sep. 4, 1998; Ser. No. 09/271,179 filed on Mar. 17, 1999; and Ser. No. 09/289,331 filed on Apr. 9, 1999.

The thick copper layer 68 may also be deposited by electroless methods. This has been reported by Pai and Ting in "Selective Electroless Copper for VLSI Interconnection", IEEE Electron Device Letters, Vol. 10, No. 9, September 1989, pg. 423, the entire disclosure of which is incorporated hereby reference.

Figure 4:
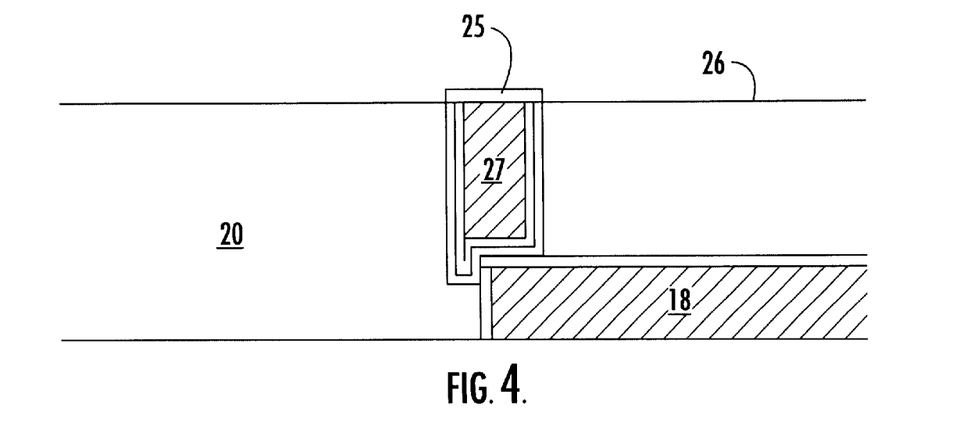
FIG. 4 is a cross-sectional view of the integrated circuit device of FIG. 3 after CMP planarization of the plated copper and selective deposition of a top side barrier film.

FIG. 4 shows the device 50 after CMP planarization and after the application of another Co-based electrolessly-deposited barrier layer 70 on the via surface. This film 70 could be about 50 to 200 Å thick. The via is now ready to receive the next overlying copper interconnect as described above and as will be readily appreciated by those skilled in the art. Alternatively, the copper via surface could simply be displacement plated with Pd, Pt, Au, Rh or other noble metal as described in Ser. No. 09/642,140 filed on Aug. 18, 2000.

Annealing would offer improved electromigration resistance as described above. Alternatively, the copper surface could be left bare and covered later with the application of the barrier film associated with the next interconnect.

Another embodiment for improved self-aligned vias is the case where dual damascene and the nitride etch stops are used, as discussed above. In this embodiment, use is made of electroless barrier layers as described above together with doped copper alloy film. This gives rise to a dual damascene based via with improved electromigration resistance and substantially complete freedom from expensive vacuum-system-based film deposition systems for metal deposition. Alternatively, the copper seed layer may be deposited by sputtering.

It will be appreciated by one-skilled in-the-art that a dual damascene structure can be used and combined with the self-aligned via process shown in FIGS. 2, 3 and 4. This requires one less nitride layer, that is, the bottom nitride film, may be eliminated.

Since copper is approximately 9 at. % soluble in Co at 100° C. or lower, Co or its alloys is not a ideal diffusion barrier for Cu, and it would be limited in the downward scaling of its thickness. A nickel-based diffusion barrier is even less robust since Cu and Ni form a continuous series of solid solutions.

Prior art diffusion barrier metals for copper that have been extensively characterized and used in the industry include Cr, W, Ta and Mo. In some cases, as is well known, the metals are combined with nitrogen in varying concentrations or with other elements to further reduce the diffusion rates of copper through the barrier material. As discussed in the parent application Ser. No. 09/045,610 filed on Mar. 20, 1998, a desirable if not necessary metallurgical property for a robust diffusion barrier is that it have very low solubility for the metal to be blocked, and that it form no compounds. In other words, the barrier metal should be virtually insoluble and immiscible with the metal to be blocked in the solid phase. Exceptions to this rule are various barriers which have been used for blocking aluminum, such as Ti, which are actually sacrificial barriers where compound formation rates are slow enough for some applications.

The metals mentioned above, that is Cr, W, Ta and Mo, all have these properties with copper. But no technology currently exits to deposit them by electroless means.

An element which has the necessary metallurgical properties, as mentioned above, for viable use as a barrier and which may also be electrolessly deposited is ruthenium. Ru is a quite conductive metal (resistivity about 7 $\mu$ ohm cm) with a high melting point of about 2300° C. It lies in Periodic Table Group VIII under iron. With copper, Ru is virtually insoluble in both the liquid and solid states.

Details for electroless plating of Ru on various metals and dielectrics are given in E. Torikai, Y. Kawami, and K. Takenaka, Japanese patent Kokai Tokkyo Kuho 84-80766

(1984). A two page description of the Japanese method may be found in "Electroless Plating" edited by Glenn O. Mallory and Juan B. Hajdu published by American Electroplaters and Surface Finishers Society, Inc. and distributed and published by Noyes Publications, New York. See page 437. The metal is deposited in nitrosylammine complexes in combination with the reducing agent hydrazine. Activation is accomplished in the usual manner with $PdCl_2$ or other noble metals in solution.

Another metal with the necessary metallurgical properties for success as a diffusion barrier for copper is rhodium. The text on electroless plating listed above gives a recipe for electroless plating of Rh on page 439.

Another metal with the necessary metallurgical properties for success as a diffusion barrier for copper is rhenium.

In the form of thin films Ru, Re or Rh may be improved in their ability to block solid state diffusion of copper by stuffing of grain boundaries with various agents such as nitrogen and trace amounts of oxygen. Alternatively, the elements may be combined with Si or other suitable refractory metals such as Cr, W, Ta and Mo and deposited by sputtering in an amorphous state as in known in the art. Any of these metals or alloys mentioned may be deposited by sputtering. A very thin film of Ti, for example, may be placed under the barrier metals to improve the adhesion to oxide dielectrics.

$RuO_2$ is a conductive oxide, with a resistivity of about $64\mu$ ohm cm, which has been explored as barrier to aluminum. Information on this work may be found, for example, in Keizo Sakiyama, et al, "Deposition and Properties of Reactively Sputtered Ruthenium Dioxide Films," J. Electrochem. Soc., Vol. 140, No.3, March 1993, page 834.

Ruthenium metal and its oxide may also be deposited by organometallic CVD methods. The CVD method is also known for excellent step coverage. M. L. Green and coworkers at AT&T Bell Labs reported such a process in the J. Blectrochem. Soc., Vol. 132, No. 11, November 1985, page 2677. Among several precursors explored, $Ru_3(CO)_{12}$ produced metallic Ru films with "excellent" film adhesion and a resistivity of $17\mu$ ohm cm.

Other related concepts and discussions are provided in the following U.S. patent applications to Cunningham: Ser. No. 09/045,610, filed on Mar. 20, 1998; Ser. No. 09/148,096 filed on Sep. 4, 1998; Ser. No. 09/271,179 filed on Mar. 17, 1999; Ser. No. 09/289,331 filed on Apr. 9, 1999; Ser. No. 09/619,587 filed on Jul. 19, 2000; Ser. No. 09/642,140 filed on Aug. 18, 2000; Ser. No. 09/657,740 filed on Sep. 8, 2000; serial No. 60/159,068 filed on Oct. 12, 1999. The entire disclosure of each of these applications is incorporated herein by reference.

The embodiments described above are provided by way of illustration only and are not intended to limit the invention. Thus, many modifications and other embodiments of the invention will come to the mind of one skilled in the art having the benefit of the teachings presented in the foregoing descriptions and the associated drawings. Accordingly, it is understood that the invention is not to be limited to the illustrated embodiments disclosed, and that other modifications and embodiments are intended to be included within the spirit and scope of the appended claims.

What is claimed is:

1. An integrated circuit comprising:
    a substrate;
    at least one dielectric layer adjacent said substrate; and
    an interconnect structure in said at least one dielectric layer and comprising a copper portion and a copper-diffusion barrier layer between said copper portion and adjacent portions of said at least one dielectric layer;
    said copper-diffusion barrier layer comprising at least one of rhodium, ruthenium and rhenium.

2. An integrated circuit according to claim 1 wherein said copper-diffusion barrier layer comprising at least one of rhodium, ruthenium and rhenium is in contact with the adjacent portions of the at least one dielectric layer.

3. An integrated circuit according to claim 2 further comprising at least one other copper-diffusion barrier layer between said copper-diffusion barrier layer comprising at least one of rhodium, ruthenium and rhenium and said copper portion.

4. An integrated circuit according to claim 1 wherein said interconnect structure extends both laterally and vertically within said at least one dielectric layer.

5. An integrated circuit according to claim 1 wherein said copper-diffusion barrier layer comprising at least one of rhodium, ruthenium and rhenium further comprises at least one of chromium, tungsten, tantalum, and molybdenum.

6. An integrated circuit according to claim 1 wherein said copper-diffusion barrier layer comprising at least one of rhodium, ruthenium and rhenium further comprises silicon.

7. An integrated circuit according to claim 1 further comprising an adhesion layer between said copper-diffusion barrier layer comprising at least one of rhodium, ruthenium and rhenium and adjacent portions of said at least one dielectric layer.

8. An integrated circuit according to claim 7 wherein said adhesion layer comprises titanium.

9. An integrated circuit according to claim 1 wherein said copper portion comprises a copper alloy.

10. An integrated circuit according to claim 1 wherein said copper portion comprises at least one of calcium, cadmium, zinc, neodymium, tellurium, and ytterbium as a dopant.

11. An integrated circuit comprising:
    a substrate;
    at least one dielectric layer adjacent said substrate; and
    an interconnect structure in said at least one dielectric layer and comprising a copper portion and a copper-diffusion barrier layer between said copper portion and adjacent portions of said at least one dielectric layer;
    said copper-diffusion barrier layer comprising rhodium.

12. An integrated circuit according to claim 11 wherein said rhodium copper-diffusion barrier layer is in contact with the adjacent portions of the at least one dielectric layer.

13. An integrated circuit according to claim 12 further comprising at least one other copper-diffusion barrier layer between said rhodium copper-diffusion barrier layer and said copper portion.

14. An integrated circuit according to claim 11 wherein said interconnect structure extends both laterally and vertically within said at least one dielectric layer.

15. An integrated circuit according to claim 11 wherein said rhodium copper-diffusion barrier layer further comprises at least one of chromium, tungsten, tantalum, and molybdenum.

16. An integrated circuit according to claim 11 wherein said rhodium copper-diffusion barrier layer further comprises silicon.

17. An integrated circuit according to claim 11 wherein said copper portion comprises a copper alloy.

18. An integrated circuit according to claim 11 wherein said copper portion comprises at least one of calcium, cadmium, zinc, neodymium, tellurium, and ytterbium as a dopant.

19. An integrated circuit comprising:

a substrate;

at least one dielectric layer adjacent said substrate; and an interconnect structure in said at least one dielectric layer and comprising a copper portion and a copper-diffusion barrier layer between said copper portion and adjacent portions of said at least one dielectric layer;

said copper-diffusion barrier layer comprising ruthenium.

20. An integrated circuit according to claim 19 wherein said ruthenium copper-diffusion barrier layer is in contact with the adjacent portions of the at least one dielectric layer.

21. An integrated circuit according to claim 20 further comprising at least one other copper diffusion barrier layer between said ruthenium copper-diffusion barrier layer and said copper portion.

22. An integrated circuit according to claim 19 wherein said interconnect structure extends both laterally and vertically within said at least one dielectric layer.

23. An integrated circuit according to claim 19 wherein said ruthenium copper-diffusion barrier layer further comprises at least one of chromium, tungsten, tantalum, and molybdenum.

24. An integrated circuit according to claim 19 wherein said ruthenium copper-diffusion barrier layer further comprises silicon.

25. An integrated circuit according to claim 19 wherein said copper portion comprises a copper alloy.

26. An integrated circuit according to claim 19 wherein said copper portion comprises at least one of calcium, cadmium, zinc, neodymium, tellurium, and ytterbium as a dopant.

27. An integrated circuit comprising:

a substrate;

at least one dielectric layer adjacent said substrate; and an interconnect structure in said at least one dielectric layer and comprising a copper portion and a copper-diffusion barrier layer between said copper portion and adjacent portions of said at least one dielectric layer;

said copper-diffusion barrier layer comprising rhenium.

28. An integrated circuit according to claim 27 wherein said rhenium copper-diffusion barrier layer is in contact with the adjacent portions of the at least one dielectric layer.

29. An integrated circuit according to claim 28 further comprising at least one other copper-diffusion barrier layer between said rhenium copper-diffusion barrier layer and said copper portion.

30. An integrated circuit according to claim 27 wherein said interconnect structure extends both laterally and vertically within said at least one dielectric layer.

31. An integrated circuit according to claim 27 wherein said rhenium copper-diffusion barrier layer further comprises at least one of chromium, tungsten, tantalum, and molybdenum.

32. An integrated circuit according to claim 27 wherein said rhenium copper-diffusion barrier layer further comprises silicon.

33. An integrated circuit according to claim 27 wherein said copper portion comprises a copper alloy.

34. An integrated circuit according to claim 27 wherein said copper portion comprises at least one of calcium, cadmium, zinc, neodymium, tellurium, and ytterbium as a dopant.

* * * * *

UNITED STATES PATENT AND TRADEMARK OFFICE
CERTIFICATE OF CORRECTION

PATENT NO.    : 6,441,492 B1
DATED         : August 27, 2002
INVENTOR(S)   : James A. Cunningham It is certified that error appears in the above-identified patent and that said Letters Patent is hereby corrected as shown below:

Title page should be deleted to appear as per attached title page.

The drawing figures consisting of figures 1-2 should be deleted to appear as per attached figures 1-2.

Signed and Sealed this

Sixteenth Day of September, 2003

JAMES E. ROGAN
*Director of the United States Patent and Trademark Office*

(12) United States Patent
Cunningham (10) Patent No.: US 6,441,492 B1
(45) Date of Patent: Aug. 27, 2002

(54) DIFFUSION BARRIERS FOR COPPER INTERCONNECT SYSTEMS

(76) Inventor: James A. Cunningham, 19771 Junipero Way, Saratoga, CA (US) 95070

(*) Notice: Subject to any disclaimer, the term of this patent is extended or adjusted under 35 U.S.C. 154(b) by 0 days.

(21) Appl. No.: 09/672,473

(22) Filed: Sep. 28, 2000

Related U.S. Application Data

(63) Continuation-in-part of application No. 09/657,740, filed on Sep. 8, 2000, which is a continuation-in-part of application No. 09/642,140, filed on Aug. 18, 2000, which is a continuation-in-part of application No. 09/619,587, filed on Jul. 19, 2000.

(60) Provisional application No. 60/159,068, filed on Oct. 12, 1999, and provisional application No. 60/153,400, filed on Sep. 10, 1999.

(51) Int. Cl.$^7$ ............................................. H01L 23/48
(52) U.S. Cl. .................. 257/762; 257/763; 257/764
(58) Field of Search .................... 257/748, 750–754, 257/762–764

(56) References Cited

U.S. PATENT DOCUMENTS

| | | | |
|---|---|---|---|
| 4,233,067 A | 11/1980 | Sawada | 75/153 |
| 4,592,891 A | 6/1986 | Nishikawa et al. | 420/491 |
| 4,732,731 A | 3/1988 | Asai et al. | 420/473 |
| 4,750,029 A | 6/1988 | Futatsuka et al. | 357/67 |
| 4,908,275 A | 3/1990 | Tsuji et al. | 428/458 |
| 4,986,856 A | 1/1991 | Tanigawa et al. | 148/11.5 C |
| 5,130,274 A | 7/1992 | Harper et al. | 437/195 |
| 5,143,867 A | 9/1992 | d'Heurle et al. | 437/188 |
| 5,592,024 A | 1/1997 | Aoyama et al. | 257/751 |
| 5,624,506 A | 4/1997 | Tsuzaki et al. | 148/433 |
| 5,674,787 A | 10/1997 | Zhao et al. | 437/230 |
| 5,694,184 A | 12/1997 | Yamada et al. | 349/43 |
| 5,719,447 A | 2/1998 | Gardner | 257/762 |
| 5,789,320 A | 8/1998 | Andricacos et al. | 438/678 |
| 6,037,257 A | 3/2000 | Chiang et al. | 438/687 |
| 6,037,664 A | 3/2000 | Zhao et al. | 257/758 |
| 6,060,892 A | 5/2000 | Yamagata | 324/754 |
| 6,066,892 A | 5/2000 | Ding et al. | 257/751 |
| 6,077,780 A | 6/2000 | Dubin | 438/687 |
| 6,147,402 A | 11/2000 | Joshi et al. | 257/751 |
| 6,157,081 A | 12/2000 | Nariman et al. | 257/752 |
| 6,174,799 B1 | 1/2001 | Lopatin et al. | 438/627 |
| 6,181,012 B1 | 1/2001 | Edelstein et al. | 257/762 |
| 6,188,120 B1 * | 2/2001 | Andricacos et al. | 257/532 |
| 6,201,271 B1 * | 3/2001 | Okutoh et al. | 257/295 |

FOREIGN PATENT DOCUMENTS

| | | | |
|---|---|---|---|
| JP | 60110868 | 6/1985 | C23C/8/42 |
| JP | 62127438 | 6/1987 | C22C/9/00 |
| JP | 62133050 | 6/1987 | C22F/1/08 |
| JP | 1028337 | 1/1989 | C22C/9/06 |
| JP | 1056842 | 3/1989 | C22C/9/00 |
| JP | 2230756 | 9/1990 | H01L/21/80 |
| JP | 9157775 | 6/1997 | C22C/9/00 |
| JP | 10008167 | 1/1998 | C22C/9/04 |
| JP | 11054713 A * | 2/1999 | |

* cited by examiner

*Primary Examiner*—Minh Loan Tran
*Assistant Examiner*—Thomas L. Dickey
(74) *Attorney, Agent, or Firm*—Allen, Dyer, Doppelt, Milbrath & Gilchrist, P.A.

(57) ABSTRACT

An integrated circuit includes a substrate, at least one dielectric layer adjacent the substrate, and an interconnect structure in the at least one dielectric layer and comprising a copper portion and a barrier layer between the copper portion and adjacent portions of the at least one dielectric layer. Moreover, the barrier layer preferably comprises at least one of rhodium, ruthenium and rhenium. These materials are virtually insoluble and immiscible in copper, and can be readily deposited by electroless deposition, for example. The barrier layer may be in contact with the adjacent portions of the at least one dielectric layer. In addition, at least one other barrier layer can be provided between the barrier layer and the copper portion. The interconnect structure in some embodiments may extend both laterally and vertically within the at least one dielectric layer.

34 Claims, 2 Drawing Sheets

FIG. 1.
(PRIOR ART)

FIG. 2.